US012784853B2

(12) United States Patent
Xiao et al.

(10) Patent No.: US 12,784,853 B2
(45) Date of Patent: Nov. 3, 2026

(54) SHIFT REGISTER UNIT, GATE DRIVING CIRCUIT AND DISPLAY DEVICE

(71) Applicant: Everdisplay Optronics (Shanghai) Co., Ltd., Shanghai (CN)

(72) Inventors: Lina Xiao, Shanghai (CN); Ying-Hsiang Tseng, Shanghai (CN); Qi Wang, Shanghai (CN); Jie Liu, Shanghai (CN)

(73) Assignee: Everdisplay Optronics (Shanghai) Co., Ltd., Shanghai (CN)

( * ) Notice: Subject to any disclaimer, the term of this patent is extended or adjusted under 35 U.S.C. 154(b) by 142 days.

(21) Appl. No.: 18/859,221

(22) PCT Filed: Sep. 20, 2023

(86) PCT No.: PCT/CN2023/119899
§ 371 (c)(1),
(2) Date: Oct. 23, 2024

(87) PCT Pub. No.: WO2025/007427
PCT Pub. Date: Jan. 9, 2025

(65) Prior Publication Data
US 2026/0188402 A1 Jul. 2, 2026

(30) Foreign Application Priority Data
Jul. 6, 2023 (CN) ......................... 202310828371.8

(51) Int. Cl.
*G11C 19/28* (2006.01)
*G09G 3/20* (2006.01)

(52) U.S. Cl.
CPC ............... *G11C 19/28* (2013.01); *G09G 3/20* (2013.01); *G09G 2310/0267* (2013.01); *G09G 2310/0286* (2013.01)

(58) Field of Classification Search
CPC .. G11C 19/28; G09G 3/20; G09G 2310/0267; G09G 2310/0286; G09G 2310/02861
See application file for complete search history.

(56) References Cited

U.S. PATENT DOCUMENTS 3,705,640 A * 12/1972 Eastcott .................. B66B 19/06 187/391
9,477,345 B2 * 10/2016 Moon .................. G09G 3/3677
(Continued)

FOREIGN PATENT DOCUMENTS

CN 104537980 A 4/2015
CN 104795106 A 7/2015
(Continued)

OTHER PUBLICATIONS

International Search Report dated Apr. 4, 2024 of International Application No. PCT/CN2023/119899.
(Continued)

*Primary Examiner* — Benyam Ketema
(74) *Attorney, Agent, or Firm* — Qing Xu

(57) ABSTRACT

The present disclosure provides a shift register unit, agate driving circuit and a display device. The shift register unit includes an input module, a first control module, a second control module, a third control module, a first output module, a. second output module, a first capacitor, a second capacitor and a. third capacitor; where the input module controls the potential of the first node, the first control module controls the potential of the second node, the third control module controls the potential of the third node, and the fourth control module controls the potential of the fourth node and the second node; the first capacitor is connected between the first node and the output terminal; the second capacitor is connected between the second node and the first
(Continued)

voltage signal lead; the third capacitor is connected between the third node and the fourth node.

19 Claims, 8 Drawing Sheets

(56) References Cited

U.S. PATENT DOCUMENTS

2005/0220262 A1* 10/2005 Moon .................... G11C 19/28
377/64
2005/0220263 A1* 10/2005 Moon .................... G11C 19/00
377/68
2006/0061562 A1* 3/2006 Park ..................... G09G 3/3677
345/204
2007/0296662 A1* 12/2007 Lee ...................... G09G 3/3677
345/87
2008/0074359 A1* 3/2008 Chung ................. G09G 3/3266
345/80
2008/0219401 A1* 9/2008 Tobita .................... G11C 19/28
377/79
2012/0212275 A1* 8/2012 Jang ...................... G11C 19/28
327/295
2013/0265291 A1 10/2013 Huang
2014/0111403 A1* 4/2014 Kim ..................... G09G 3/3266
377/64
2015/0302813 A1* 10/2015 Yu .......................... G11C 19/28
345/204
2016/0232847 A1* 8/2016 Lee ...................... G09G 3/3266
2016/0358564 A1* 12/2016 Xiao ........................ G09G 3/20
2020/0043404 A1* 2/2020 Yu ........................ G09G 3/3266

FOREIGN PATENT DOCUMENTS

CN 105741749 A 7/2016
CN 105989797 A 10/2016
CN 106328042 A 1/2017
CN 106448540 A 2/2017
CN 106652867 A 5/2017
CN 106653089 A 5/2017
CN 107025872 A 8/2017
CN 107316599 A 11/2017
CN 109147635 A 1/2019
CN 113939914 A 1/2022
CN 116343666 A 6/2023
CN 116741080 A 9/2023
WO 2021217546 A1 11/2021
WO 2025007427 A1 1/2025

OTHER PUBLICATIONS

1st Office Action dated Oct. 24, 2025 of Chinese Application No. 202310828371.8.
2nd Office Action dated Mar. 5, 2026 of Chinese Application No. 202310828371.8.

* cited by examiner

SHIFT REGISTER UNIT, GATE DRIVING CIRCUIT AND DISPLAY DEVICE

CROSS REFERENCE TO RELATED APPLICATION

The present application is a U.S. National Stage of International Application No. PCT/CN2023/119899, filed on Sep. 20, 2023, which claims the benefit of priority to Chinese Application No. 202310828371.8, filed on Jul. 6, 2023, both of which are incorporated by reference herein in their entireties for all purposes.

TECHNICAL FIELD

The present disclosure relates to the field of display technology, and in particular to a shift register unit, a gate driving circuit and a display device.

BACKGROUND

The display device includes not only a display panel, but also a gate driving circuit (also called a row driving circuit) and a source driving circuit (also called a column driving circuit, Source Driver) for controlling the display of the display panel with a pixel array. The display panel adopts a progressive scanning display mode, where the gate driving circuit is configured to generate a scanning signal to turn on each row of pixels in turn, and the source driving circuit is configured to provide a data signal to a row of pixels when the row of pixels is turned on to realize the display of the pixels.

The gate driving circuit includes a shift register. The shift register includes a plurality of cascaded shift register units, where each stage of the shift register unit usually mainly includes several transistors, and a level signal (that is, a Gout signal) is output at the output terminal by inputting a clock signal CK and an input signal IN/in (that is, a start pulse signal) into the circuit.

A shift register unit is disclosed in Chinese patent CN105989797A. FIG. 1 shows a schematic diagram of on-off of the shift register unit disclosed in Chinese patent CN105989797A at moment t2', where "H" represents a high-level signal and "L" represents a low-level signal. FIG. 2 shows a driving timing diagram of the shift register unit disclosed in Chinese patent CN105989797A. As shown in FIG. 1, at moment t2', the shift register unit outputs a low-level first clock signal CK1' through an eighth transistor T8'. Under normal circumstances, when the shift register unit enters moment t3', a fourth transistor T4' is turned on by a second clock signal CK2' at a low level, and the first node N1' changes from the original high level to a low level, thereby turning on a fifth transistor T5' and a seventh transistor T7'. The second node N2' changes to a high level due to the fifth transistor T5' turning on and the eighth transistor T8' turns off. The seventh transistor T7' turns on and outputs a high-level VDD' signal. However, if the impedance of CK2' wiring is too large upon entering the moment t3', or the threshold voltage shifts under long-term operation of the second transistor T2' and the fourth transistor T4', etc., the potential written into the first node N1' will be too high, so that the fifth transistor T5' turns on slowly or cannot turns on, causing the potential of the second node N2' to be unable to be updated at the second moment t2', and still maintain at a low potential. The sixth transistor T6' continues to be turned on to allow VDD' to be written into the first node N1'. The potential of the first node N1' is higher, and the gate voltage of the fifth transistor T5' is larger, which in turn causes the seventh transistor T7' to be turned off, the eighth transistor T8' to be turned on, and Gout' continues to output the abnormal waveform of CK1' (the Abnormal Gout waveform shown in FIG. 2), resulting in the failure of the display screen. Therefore, the fifth transistor T5' and the sixth transistor T6' need to restrain each other to solve the abnormal output problem of the shift register unit caused by the abnormal update of the potential of the first node N1' and the second node N2'.

SUMMARY

The embodiments of the present disclosure provide a shift register unit, including:

- an input module configured to transmit a signal at an input terminal of the shift register unit to a first node in response to a second clock signal;
- a first control module configured to transmit the second clock signal to a second node in response to a signal at the first node;
- a second control module configured to transmit a first voltage signal or a first clock signal to a third node in response to the signal at the input terminal; and configured to transmit a second voltage signal to the third node in response to the first clock signal;
- a third control module configured to transmit the second voltage signal to a fourth node in response to the second clock signal; and configured to transmit the second voltage signal or a signal at the second node to the fourth node in response to a signal at the third node; and configured to transmit the second voltage signal to the second node in response to the second clock signal and the signal at the third node;
- a first output module configured to transmit the first voltage signal to an output terminal of the shift register unit in response to the signal at the second node;
- a second output module configured to transmit the first clock signal to the output terminal in response to the signal at the first node;
- a first capacitor connected between the first node and the output terminal;
- a second capacitor connected between the second node and a first voltage signal lead; and
- a third capacitor connected between the third node and the fourth node.

The embodiments of the present disclosure provide a gate driving circuit, including the shift register unit mentioned above.

The embodiments of the present disclosure provide a display device, including the gate driving circuit mentioned above.

BRIEF DESCRIPTION OF THE DRAWINGS

By reading the detailed description of the non-limiting embodiments with reference to the following drawings, other features, purposes and advantages of the present disclosure will become more apparent.

DETAILED DESCRIPTION

Figure 1:
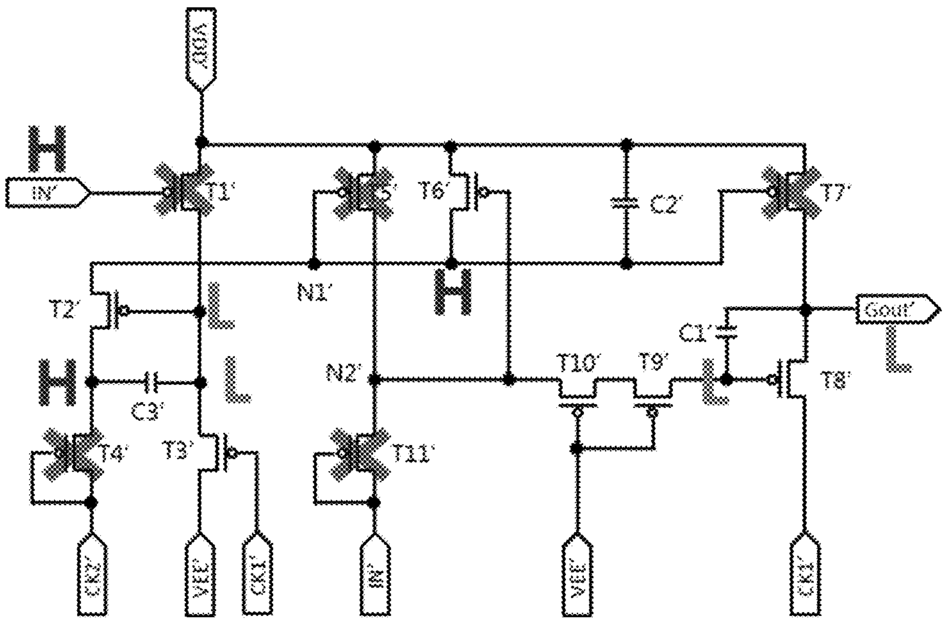
FIG. 1 (Prior Art)
FIG. 1 is a schematic diagram of a shift register unit disclosed in the prior art.
Figure 2:
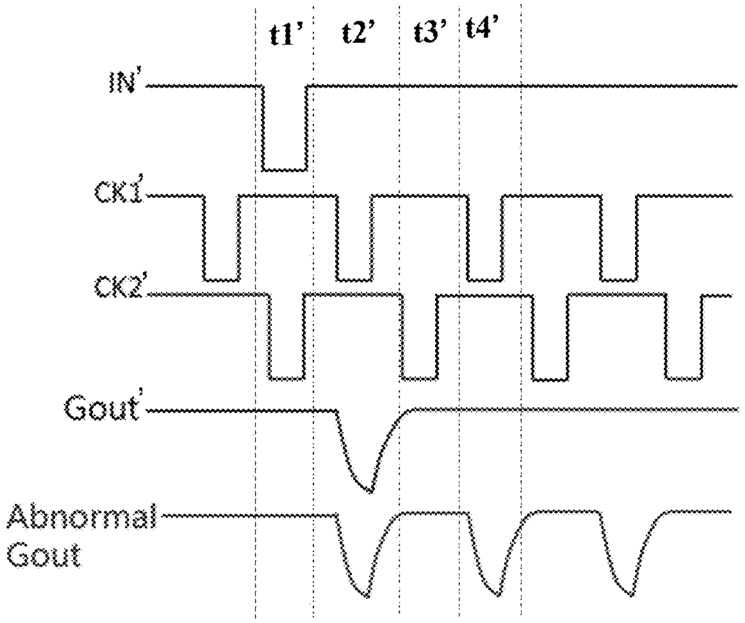
FIG. 2 (Prior Art)
FIG. 2 is a driving timing diagram of a shift register unit disclosed in the prior art.

The example embodiments will now be described more fully with reference to the accompanying drawings. However, the example embodiments can be implemented in a variety of forms and should not be construed as being limited to the embodiments set forth herein; rather, these embodiments are provided so that the present disclosure will be comprehensive and complete and the concept of the example embodiments will be fully conveyed to those skilled in the art. The same reference numerals in the figures represent the same or similar structures, and thus their repeated descriptions will be omitted. "or" in the specification may both represent "and" or "or".

In the specification, the reference terms "one embodiment", "some embodiments", "examples", "specific examples", or "some examples" and the like mean that the specific features, structures, materials or characteristics represented in conjunction with the embodiment or example are included in at least one embodiment or example of the present disclosure. Moreover, the specific features, structures, materials or characteristics represented may be combined in any one or more embodiments or examples in a suitable manner. In addition, the different embodiments or examples represented in the present disclosure and the features of the different embodiments or examples may be combined by those skilled in the art without contradiction.

In addition, the terms "first" and "second" are used only for representation purposes and cannot be understood as indicating or implying relative importance or implicitly indicating the number of technical features indicated. Therefore, the features defined as "first" and "second" may explicitly or implicitly include at least one of the features. In the specification, "multiple" means two or more, unless otherwise clearly and specifically defined.

Figure 3:
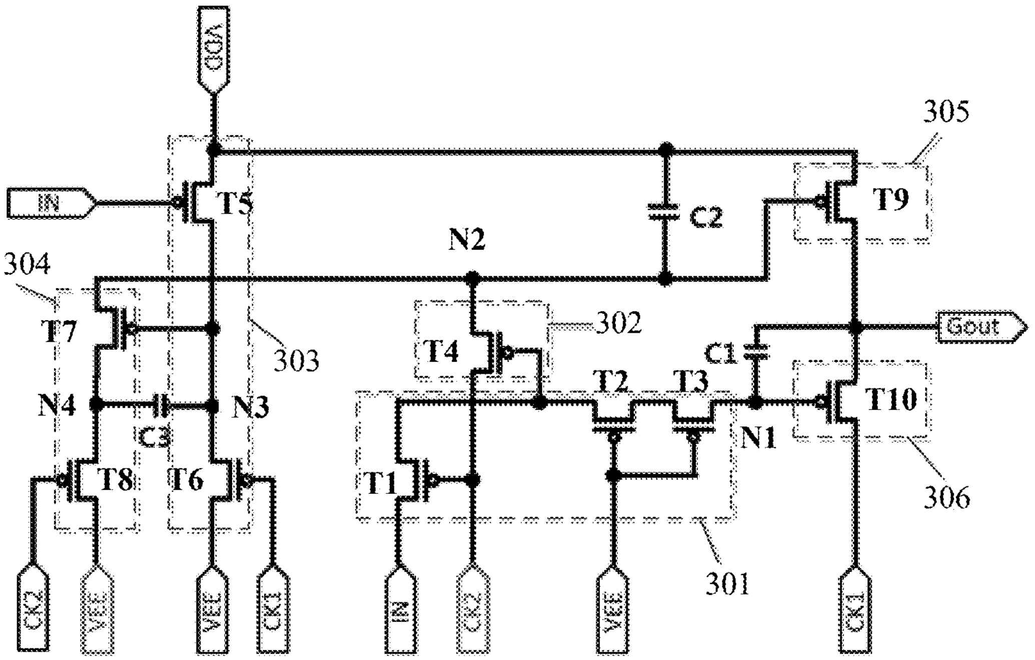
FIG. 3 is a schematic diagram of a shift register unit provided in an embodiment of the present disclosure.

To solve the problems of the prior art, an embodiment of the present disclosure provides a shift register unit, as shown in FIG. 3. The shift register unit includes:

an input module configured to transmit an input signal IN at an input terminal of the shift register unit to a first node N1 in response to a second clock signal CK2;

a first control module configured to transmit the second clock signal CK2 to a second node N2 in response to a signal of the first node N1;

a second control module configured to transmit a first voltage signal VDD to a third node N3 in response to the input signal IN; and configured to transmit a second voltage signal VEE to the third node N3 in response to a first clock signal CK1;

a third control module configured to transmit the second voltage signal VEE to a fourth node N4 in response to the second clock signal CK2; and configured to transmit a signal of the second node N2 to the fourth node N4 in response to a signal of the third node N3; and configured to transmit a signal of the fourth node N4 to the second node N2 in response to the second clock signal CK2 and the signal of the third node N3;

a first output module configured to transmit the first voltage signal VDD to the output terminal of the shift register unit in response to the signal of the second node N2;

a second output module configured to transmit the first clock signal CK1 to the output terminal in response to the signal of the first node N1;

a first capacitor C1 connected between the first node N1 and the output terminal;

a second capacitor C2 connected between the second node N2 and the first voltage signal lead; and a third capacitor C3 connected between the third node N3 and the fourth node N4.

The frequency of the first clock signal CKV1 is same as the frequency of the second clock signal CKV2, and the phase of the first clock signal CKV1 is opposite to the phase of the second clock signal CKV2. The first voltage signal VDD is a positive voltage signal, and the second voltage signal VEE is a negative voltage signal.

The input module controls the potential of the first node, the first control module controls the potential of the second node, the second control module controls the potential of the third node, and the third control module controls the potentials of the fourth node and the second node. The first capacitor is connected between the first node and the output terminal. The second capacitor is connected between the second node and the first voltage signal lead. The third capacitor is connected between the third node and the fourth node. The first node and the second node of the present disclosure independently update the potential respectively, without mutual restraint, which can ensure the correctness and effectiveness of the output signal waveform of the output terminal.

Please continue to refer to FIG. 3, the input module 301 includes a first transistor T1. The control terminal of the first transistor T1 is electrically connected to the second clock signal lead, the first terminal of the first transistor T1 is electrically connected to the input terminal, and the second terminal of the first transistor T1 is electrically connected to the first node N1.

The input module 301 also includes a second transistor T2 and a third transistor T3. The control terminal of the second transistor T2 is electrically connected to the second voltage signal lead, the first terminal of the second transistor T2 is electrically connected to the second terminal of the first transistor T1, and the second terminal of the second transistor T2 is electrically connected to the first terminal of the third transistor T3. The second terminal of the third transistor T3 is electrically connected to the first node N1. In other embodiments, only one of the second transistor T2 and the third transistor T3 may be selected to reduce the number of transistors in the circuit and reduce the difficulty of circuit layout.

The first control module 302 includes a fourth transistor T4. The control terminal of the fourth transistor T4 is electrically connected to the first node N1, the first terminal of the fourth transistor T4 is electrically connected to the second clock signal, and the second terminal of the fourth transistor T4 is electrically connected to the second node N2.

The second control module 303 includes a fifth transistor T5. The control terminal of the fifth transistor T5 is electrically connected to the input terminal, the first terminal of the fifth transistor T5 is electrically connected to the first voltage signal lead, and the second terminal of the fifth transistor T5 is electrically connected to the third node N3.

The second control module 303 also includes a sixth transistor T6. The control terminal of the sixth transistor T6 is electrically connected to the first clock signal lead, the first terminal of the sixth transistor T6 is electrically connected to the second voltage signal lead, and the second terminal of the sixth transistor T6 is electrically connected to the third node N3.

The third control module 304 includes a seventh transistor T7. The control terminal of the seventh transistor T7 is electrically connected to the third node N3, the first terminal of the seventh transistor T7 is electrically connected to the fourth node N4, and the second terminal of the seventh transistor T7 is electrically connected to the second node N2.

The third control module 304 also includes an eighth transistor T8. The control terminal of the eighth transistor T8 is electrically connected to the second clock signal lead, the first terminal of the eighth transistor T8 is electrically connected to the second voltage signal lead, and the second terminal of the eighth transistor T8 is electrically connected to the fourth node N4.

The first output module 305 includes a ninth transistor T9. The control terminal of the ninth transistor T9 is electrically connected to the second node N2, the first terminal of the ninth transistor T9 is electrically connected to the first voltage signal lead, and the second terminal of the ninth transistor T9 is electrically connected to the output terminal.

The second output module 306 includes a tenth transistor T10. The control terminal of the tenth transistor T10 is electrically connected to the first node N1, the first terminal of the tenth transistor T10 is electrically connected to the first clock signal lead, and the second terminal of the tenth transistor T10 is electrically connected to the output terminal.

In this embodiment, the first transistor T1 to the tenth transistor T10 are all PMOS transistors. The control terminal of the PMOS transistor is the gate, the first terminal is the source, and the second terminal is the drain. The on level of the PMOS transistor is a low level, and the off level of the PMOS transistor is a high level. In some other embodiments, those skilled in the art can easily conclude that the shift register unit provided by the present disclosure can be easily changed to all N-type transistors. Or, the shift register unit provided by the present disclosure can be easily changed to all CMOS transistors, etc.

Figure 4:
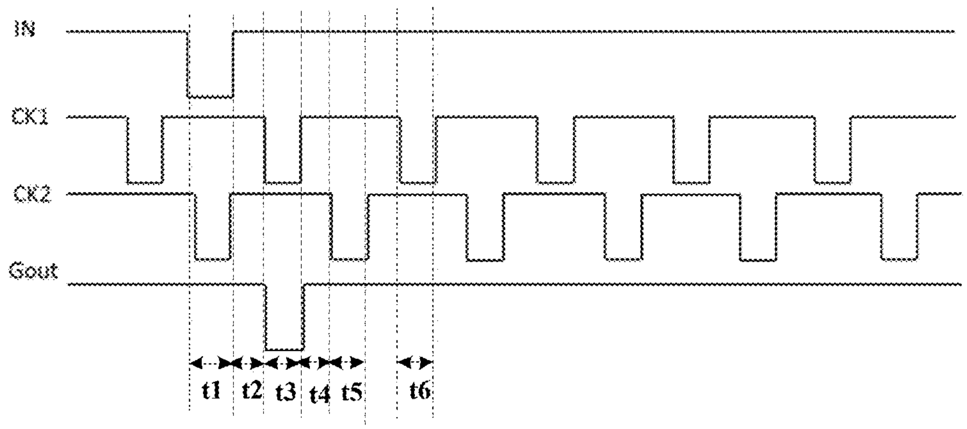
FIG. 4 is a driving timing diagram of a shift register unit provided in an embodiment of the present disclosure.

FIG. 4 shows a timing diagram of the shift register unit, and the working principle of the shift register provided by the embodiment of the present disclosure is explained in conjunction with FIG. 4. It should be noted that, for ease of understanding, the high-level signal is represented by "H", and the low-level signal is represented by "L" in the accompanying drawings.

Figure 5:
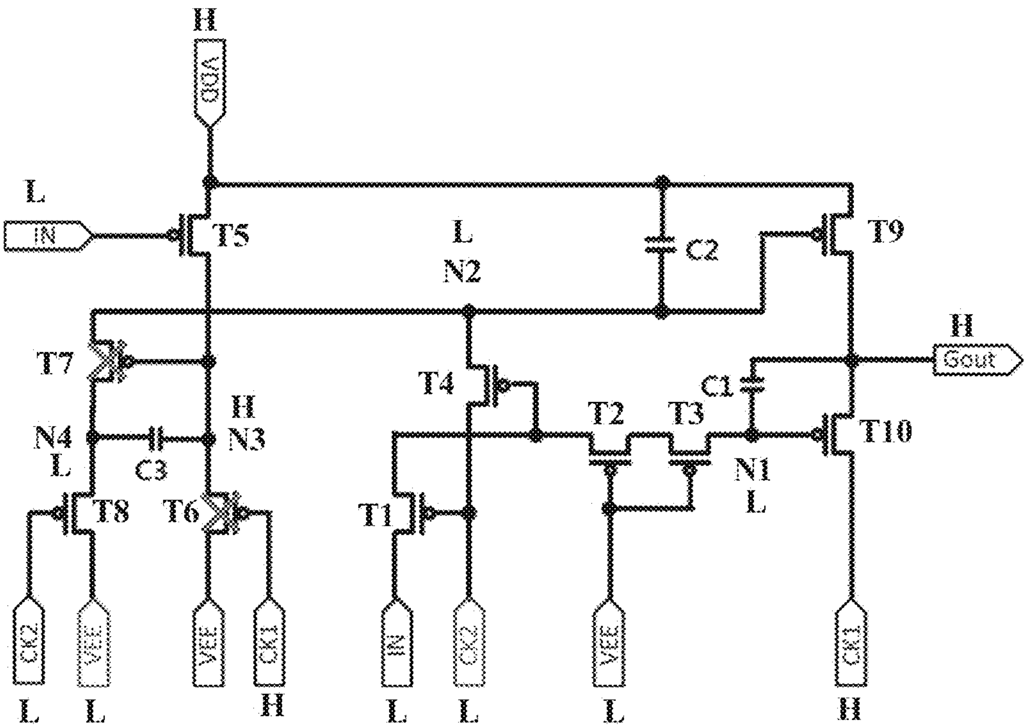
FIGS. 5 to 10 are schematic diagrams of circuit on-off of a shift register unit of an embodiment of the present disclosure in a first time period t1 to a sixth time period t6.

FIG. 4 shows the driving timing of the shift register unit in the first time period t1. FIG. 5 shows a schematic diagram of the circuit on and off in the shift register unit in the first time period t1. Combining FIG. 4 and FIG. 5, it can be obtained that in the first time period t1, the input signal IN is at low level, the first clock signal CK1 is at high level, the second clock signal CK2 is at low level, the first transistor T1, the fifth transistor T5, the eighth transistor T8 are turned on, and the sixth transistor T6 is turned off. The second voltage signal VEE is a continuous low-level signal. Therefore, when the second voltage signal VEE is continuously output, the second transistor T2 and the third transistor T3 are continuously turned on. The reasons for the conduction of the second transistor T2 and the third transistor T3 are no longer explained in the following stages. The first voltage signal VDD is transmitted to the third node N3 through the fifth transistor T5. The signal of the third node N3 is at high level, and the seventh transistor T7 is turned off. The second voltage signal VEE is transmitted to the fourth node N4 through the eighth transistor T8. The signal of the fourth node N4 is at low level, and the third capacitor C3 is charged at this time. The low-level input signal IN is transmitted to the first node N1 through the first transistor T1, the second transistor T2 and the third transistor T3. The signal of the first node N1 is at low level, and the fourth transistor T4 and the tenth transistor T10 are turned on. The second clock signal CK2 is transmitted to the second node N2 through the fourth transistor T4, the signal of the second node N2 is at low level, the ninth transistor T9 is turned on, and the second capacitor C2 is charged under the action of the first voltage signal VDD and the second node N2. The first voltage signal VDD is transmitted to the output terminal through the ninth transistor T9. The first clock signal CK1 is transmitted to the output terminal through the tenth transistor T10, at which time the output terminal outputs a high-level first voltage signal and a high-level first clock signal, and the output signal of the output terminal is at high level. The first capacitor C1 is charged under the action of the first node N1 and the output terminal.

Figure 6:
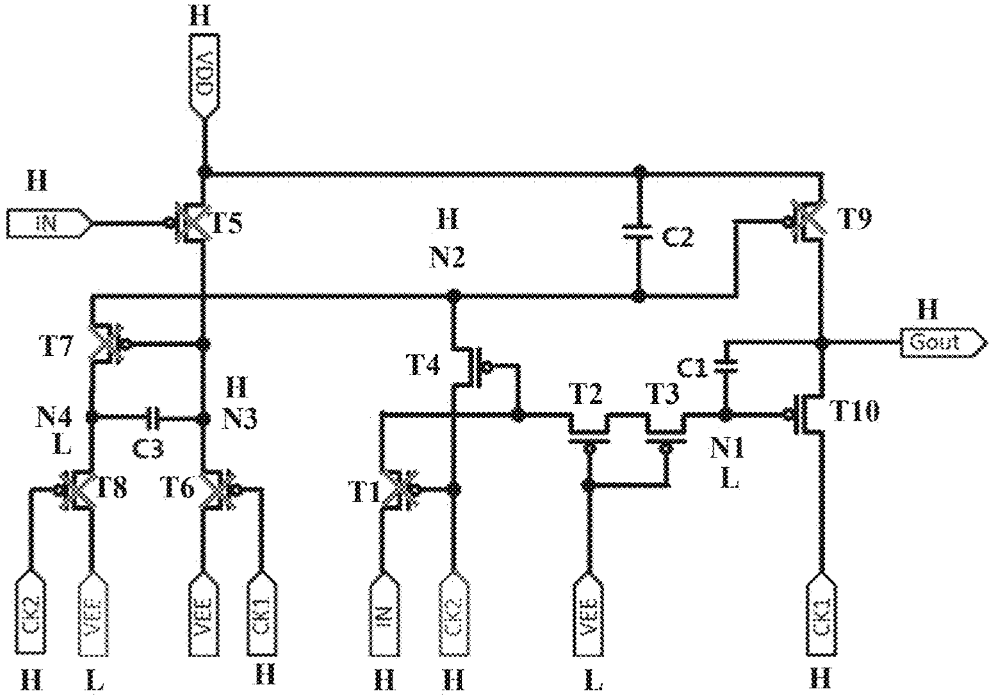

FIG. 4 shows the driving timing of the shift register unit in the first time period t2. FIG. 6 shows a schematic diagram of the circuit on and off in the shift register unit in the second time period t2. Combining FIG. 4 and FIG. 6, it can be obtained that in the second time period t2, the input signal IN is at high level, the first clock signal CK1 is at high level, the second clock signal CK2 is at high level, and the first transistor T1, the fifth transistor T5, the sixth transistor T6, the seventh transistor T7 and the eighth transistor T8 are turned off. Under the action of low level at the first terminal of the first capacitor C1, the fourth transistor T4 and the tenth transistor T10 are still turned on, and the second clock signal CK2 is transmitted to the second node N2 through the fourth transistor T4. That is, the high-level second clock signal CK2 updates the potential of the second node N2. The signal of the second node N2 is at high level, and the ninth transistor T9 is turned off. The first clock signal CK1 is transmitted to the output terminal through the tenth transistor T10, and the output signal of the output terminal is the high-level first clock signal CK1.

Figure 7:
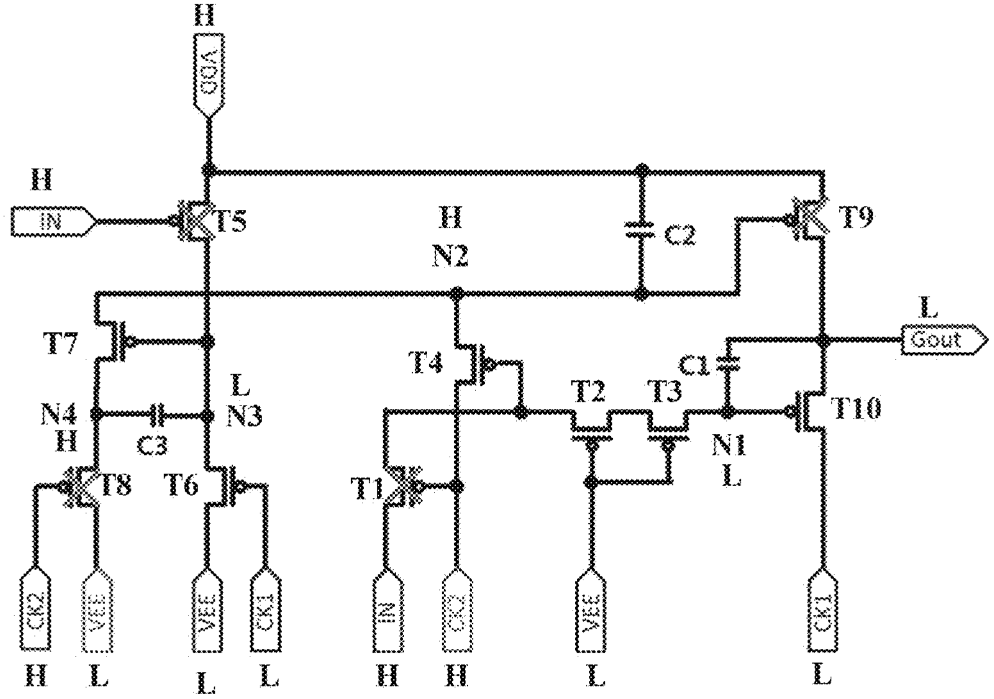

FIG. 4 shows the driving timing of the shift register unit in the third time period t3. FIG. 7 shows a schematic diagram of the circuit on and off in the shift register unit in the third time period t3. Combining FIG. 4 and FIG. 7, it can be obtained that in the third time period t3, the input signal IN is at high level, the first clock signal CK1 is at low level, and the second clock signal CK2 is at high level, then the first transistor T1, the fifth transistor T5 and the eighth transistor T8 are turned off, and the sixth transistor T6 is turned on. When the signal at the first terminal of the first capacitor C1 is at a low level, the fourth transistor T4 and the tenth transistor T10 are turned on, the second clock signal CK2 is transmitted to the second node N2 through the fourth transistor T4, the signal at the second node N2 is at a high level, and the ninth transistor T9 remains in an off state. The first clock signal CK1 is transmitted to the output terminal through the tenth transistor T10. The second voltage signal VEE is transmitted to the third node N3 through the sixth transistor T6. The signal at the third node N3 is at a low level. Under the action of the third node N3, the seventh transistor T7 is turned on, and the high level of the second node N2 is transmitted to the fourth node N4, and the third capacitor C3 is charged at this time. At this time, the output terminal outputs the first clock signal CK1 at a low level.

Figure 8:
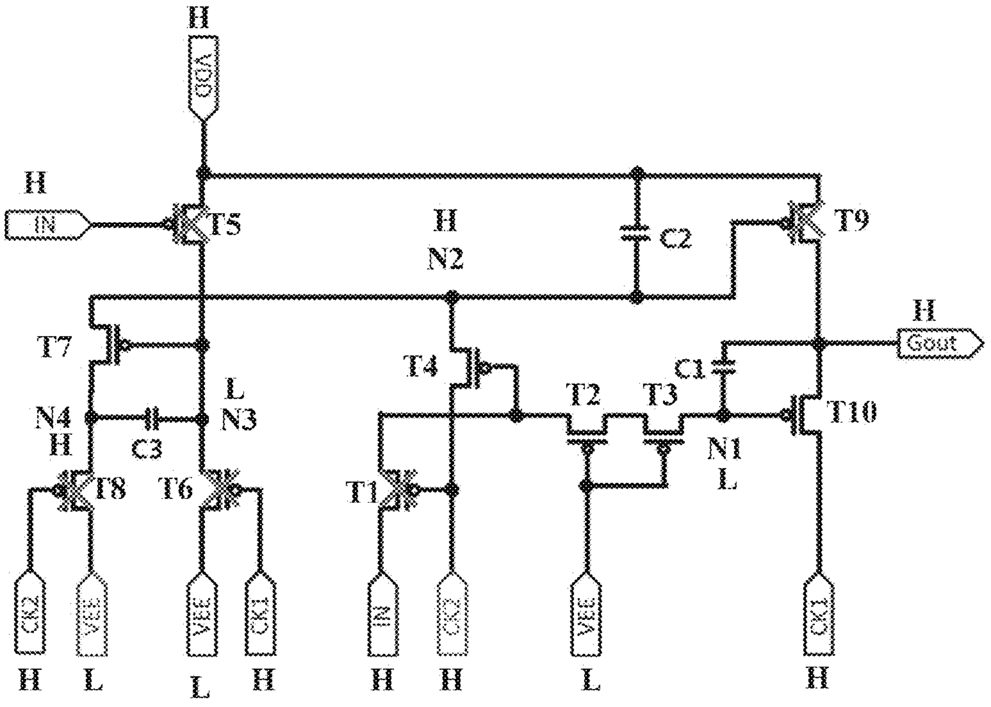

FIG. 4 shows the driving timing in the fourth time period t4. FIG. 8 shows a schematic diagram of the circuit on-off in the shift register unit in the fourth time period t4. Combining FIG. 4 and FIG. 8, it can be seen that in the fourth time period t4, the input signal IN is at a high level, the first clock signal CK1 is at a high level, the second clock signal CK2 is at a high level, and the first transistor T1, the fifth transistor T5, the sixth transistor T6 and the eighth transistor T8 are turned off. Under the action of the first capacitor C1, the fourth transistor T4 and the tenth transistor T10 are turned on, and the second clock signal CK2 is transmitted to the second node N2. Under the action of the second node N2, the ninth transistor T9 is turned off. Under the action of the third capacitor C3, the seventh transistor T7 is turned on, and the signal of the second node N2 is transmitted to the fourth node N4 through the seventh transistor T7, and the third capacitor C3 is charged. The first clock signal CK1 is transmitted to the output terminal through the tenth transistor T10, and the signal at the output terminal is the high-level first clock signal CK1.

Figure 9:
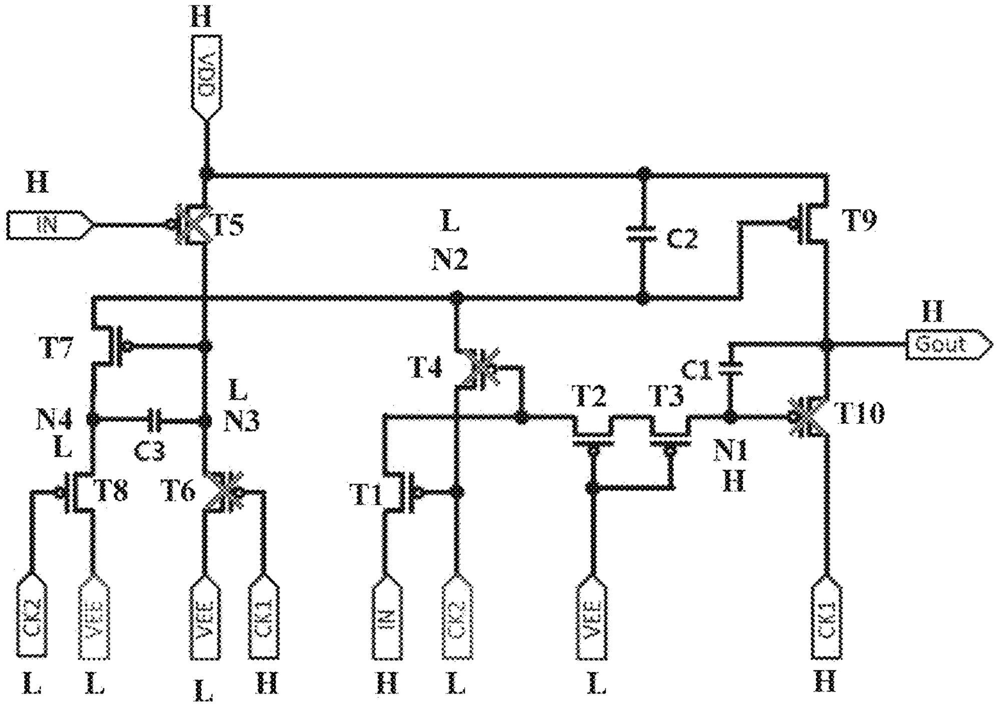

FIG. 4 shows the driving timing in the fifth time period t5. FIG. 9 shows a schematic diagram of the circuit on and off in the shift register unit in the fifth time period t5. Combining FIG. 4 and FIG. 9, it can be obtained that in the fifth time period t5, the input signal IN is at a high level, the first clock signal CK1 is at a high level, the second clock signal CK2 is at a low level, the fourth transistor T4, the fifth transistor T5 and the sixth transistor T6 are turned off, and the first transistor T1 and the eighth transistor T8 are turned on. The input signal IN is transmitted to the first node N1 through the first transistor T1, and the signal of the first node N1 is at a high level, then the tenth transistor T10 is turned off. The second voltage signal VEE is transmitted to the fourth node N4 through the eighth transistor T8, and the signal of the fourth node N4 is at a low level. Under the action of capacitor bootstrapping, the signal potential of the third node N3 is further reduced, and the signal of the third node N3 is at a low level, and the seventh transistor T7 is turned on. The second voltage signal VEE is transmitted to the second node N2 through the seventh transistor T7, and the signal of the second node N2 is at a low level, then the ninth transistor T9 is turned on, and the first voltage signal VDD is transmitted to the output terminal through the ninth transistor T9, and the output signal Gout of the output terminal is the first voltage signal VDD at a high level. The second capacitor C2 is charged under the action of the second node N2 and the first voltage signal VDD. In the fifth time period t5, the potential of the second node N2 is updated by the second voltage signal VEE, the potential of the first node N1 is updated to a high level by the input signal IN, the tenth transistor T10 is turned off, the potential of the second node N2 is updated to a low level by the second voltage signal VEE, the ninth transistor T9 is turned on, ensuring that only the first voltage signal VDD is transmitted to the output terminal through the ninth transistor, and the tenth transistor T10 is turned off. The potential updates of the first node N1 and the second node N2 do not affect or restrain each other, which can ensure the correctness of the output waveform.

Figure 10:
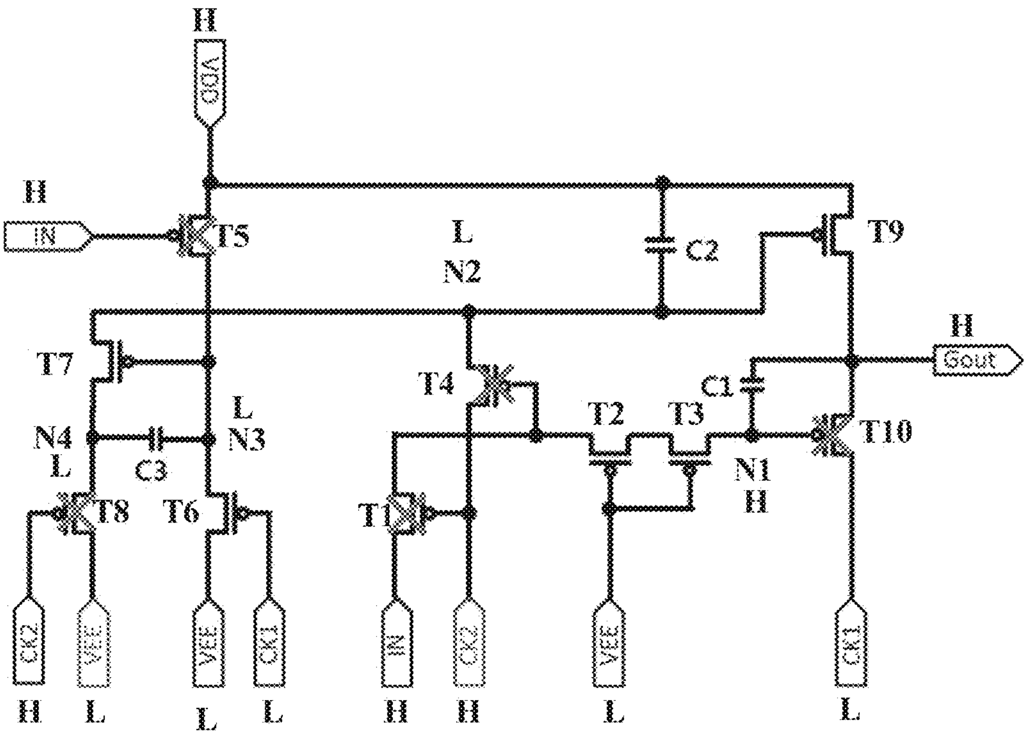

FIG. 4 shows the driving timing in the sixth time period t6. FIG. 10 shows a schematic diagram of the circuit on-off in the shift register unit in the sixth time period t6. Combining FIG. 4 and FIG. 10, it can be obtained that the first clock signal CK1 is at a low-level signal, the second clock signal CK2 is at a high-level signal, and the input signal IN is at a high level, then the first transistor T1, the fifth transistor T5, and the eighth transistor T8 are turned off, and the sixth transistor T6 is turned on. The first node N1 is kept at a high-level signal under the action of the first capacitor C1, and the tenth transistor T10 is turned off. The second voltage signal VEE is transmitted to the third node N3 through the sixth transistor T6, and the seventh transistor T7 is turned on under the action of the third node N3. Under the action of the third capacitor C3, the fourth node N4 still remains at a low-level signal, and through the seventh transistor T7, the signal of the fourth node N4 is transmitted to the second node N2, the potential of the second node N2 is at a low level, the ninth transistor T9 is turned on, the first voltage signal VDD is transmitted to the output terminal through the ninth transistor T9, and the output signal Gout of the output terminal is the first voltage signal VDD of high level. The update of the potential of the second node N2 is not affected by the first node N1, which can ensure the correctness and effectiveness of the output waveform.

The shift register unit repeats the fifth time period t5 and the sixth time period t6 in the subsequent working steps, which will not be repeated here, until the next frame of the image starts to be displayed and the t1~t4 working steps are started again.

Figure 11:
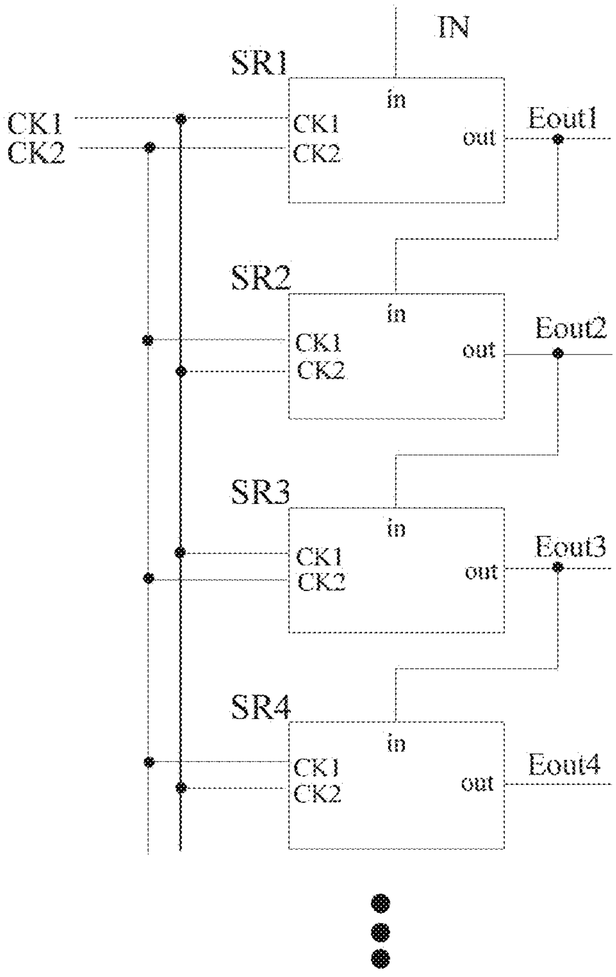
FIG. 11 is a schematic diagram of a gate driving circuit provided in an embodiment of the present disclosure.

As shown in FIG. 11, the embodiment of the present disclosure also provides a gate driving circuit, including the shift register unit as described above. The gate driving circuit includes a plurality of the above-mentioned shift register units. The plurality of shift register units are electrically connected in a cascade manner. The input terminal of the first-stage shift register unit is connected to a low-level start pulse signal, and the output signal terminal of each stage of the remaining of shift register units, except for the last-stage shift register unit, is connected to the input signal terminal of the next-stage shift register unit.

The plurality of shift register units are electrically connected in a cascade manner, where the input signal of the first-stage shift register unit is connected to the start pulse signal, and the output signal terminal of each stage of the remaining shift register units, except for the last-stage shift register, is connected to the input terminal of the next-stage shift register unit.

Specifically, in FIG. 11, four cascaded shift register units are taken as an example. The input signal IN of the input terminal in of the first-stage shift register unit SR1 is the start pulse signal. The output signal Eout1 of the output terminal out of the first-stage shift register unit SR1 is used as the input signal of the second-stage shift register unit SR2, and the output terminal out of the first-stage shift register unit SR1 is connected to the input terminal in of the second-stage shift register unit SR2. The output signal Eout2 of the second-stage shift register unit SR2 is used as the input signal of the third-stage shift register unit SR3, and the output terminal out of the second-stage shift register unit SR2 is connected to the input terminal in of the third-stage shift register unit SR3. The output signal Eout3 of the third-stage shift register unit SR3 is used as the input signal of the fourth-stage shift register unit SR4, and the output terminal of the third-stage shift register unit SR3 is connected to the input terminal in of the fourth-stage shift register unit SR4 . . . This is repeated to form a gate driving circuit.

As shown in FIG. 11, the gate driving circuit also includes a clock signal generating unit (not shown in the figure). The clock signal generating unit is configured to generate a first clock signal CK1 and a second clock signal CK2. Specifically, the first clock signal CK1 and the second clock signal CK2 in the first-stage shift register unit SR1 are respectively the first clock signal CK1 and the second clock signal CK2 generated by the clock signal generating unit. The first clock signal CK1 and the second clock signal CK2 in the second-stage shift register unit SR2 are respectively the second clock signal CK2 and the first clock signal CK1 generated by the clock signal generating unit. The first clock signal CK1 and the second clock signal CK2 in the third-stage shift register unit SR3 are respectively the first clock signal CK1 and the second clock signal CK2 generated by the clock signal generating unit. The first clock signal CK1 and the second clock signal CK2 in the fourth-stage shift register unit SR4 are respectively the second clock signal CK2 and the first clock signal CK1 generated by the clock signal generating unit; and so on. The first clock signal CK1 and the second clock signal CK2 in the n-stage shift register unit SRn are respectively the first clock signal CK1 and the second clock signal CK2 generated by the clock signal generating unit. The first clock signal CK1 and the second clock signal CK2 in the (n+1)-stage shift register unit SRn+1 are respectively the second clock signal CK2 and the first clock signal CK1 generated by the clock signal generating unit.

Figure 12:
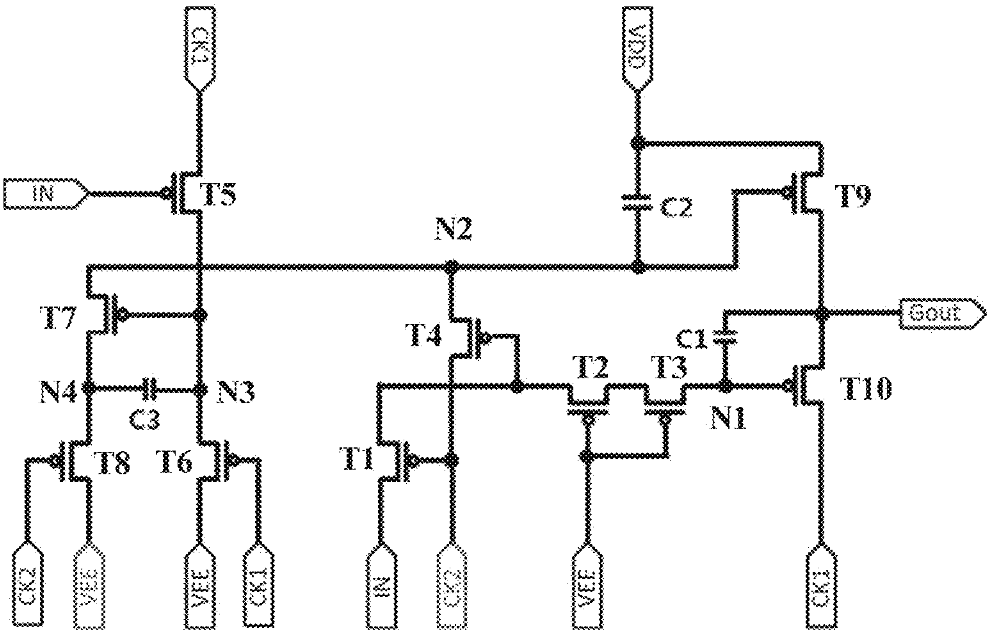
FIG. 12 is a schematic diagram of a shift register unit in another embodiment of the present disclosure.

As shown in FIG. 12, the embodiment of the present disclosure also provides another shift register unit, which is different from the shift register unit in the previous embodiment in that the first terminal of the first transistor T1 in the second control module is electrically connected to the first clock signal lead, and the second control module is configured to transmit the first clock signal CK1 to the third node N3 in response to the signal at the input terminal. The shift register unit provided in FIG. 12 can achieve the same technical effect as the shift register unit in the previous embodiment, which will not be repeated here. When the shift register is working, only the working steps in the first time period t1 are different from the previous embodiment, and the remaining working steps are the same as the shift register in the previous embodiment. In the first time period t1, the first clock signal CK1 is transmitted to the third node N3 through the fifth transistor T5, and the signal of the third node N3 is at a high level.

The embodiment of the present disclosure also provides a display device, including the gate driving circuit as described above, which can achieve the technical effect of the above embodiment.

The shift register unit, gate driving circuit and display device provided by the present disclosure have the following advantages:

In the present disclosure, the input module controls the potential of the first node, the first control module controls the potential of the second node, the second control module controls the potential of the third node, and the third control module controls the potentials of the fourth node and the second node; the first capacitor is connected between the first node and the output terminal; the second capacitor is connected between the second node and the first voltage signal lead; the third capacitor is connected between the third node and the fourth node. The potentials of the first node and the second node can be updated independently without mutual restraint, ensuring the correctness and effectiveness of the output signal waveform at the output terminal and the normal display of the display device.

The above content is a further detailed description of the present disclosure in combination with specific embodiments, and it cannot be determined that the specific implementation of the present disclosure is limited to these descriptions. For those skilled in the art to which the present disclosure belongs, without departing from the concept of the present disclosure, several simple deductions or substitutions can be made, which should be regarded as belonging to the protection scope of the present disclosure.

What is claimed is:

1. A shift register unit, comprising:

an input module configured to transmit a signal at an input terminal of the shift register unit to a first node in response to a second clock signal;

a first control module configured to transmit the second clock signal to a second node in response to a signal at the first node;

a second control module configured to transmit a first voltage signal or a first clock signal to a third node in response to the signal at the input terminal; and configured to transmit a second voltage signal to the third node in response to the first clock signal;

a third control module configured to transmit the second voltage signal to a fourth node in response to the second clock signal; and configured to transmit the second voltage signal or a signal at the second node to the fourth node in response to a signal at the third node; and configured to transmit the second voltage signal to the second node in response to the second clock signal and the signal at the third node;

a first output module configured to transmit the first voltage signal to an output terminal of the shift register unit in response to the signal at the second node;

a second output module configured to transmit the first clock signal to the output terminal in response to the signal at the first node;

a first capacitor connected between the first node and the output terminal;

a second capacitor connected between the second node and a first voltage signal lead; and a third capacitor connected between the third node and the fourth node.

2. The shift register unit according to claim 1, wherein the input module comprises a first transistor, a control terminal of the first transistor is electrically connected to a second clock signal lead, a first terminal of the first transistor is electrically connected to the input terminal, and a second terminal of the first transistor is electrically connected to the first node.

3. The shift register unit according to claim 2, wherein the input module further comprises a second transistor and a third transistor, a control terminal of the second transistor is electrically connected to a second voltage signal lead, a first terminal of the second transistor is electrically connected to the second terminal of the first transistor, and a second terminal of the second transistor is electrically connected to a first terminal of the third transistor;

a control terminal of the third transistor is electrically connected to the second voltage signal lead, and a second terminal of the third transistor is electrically connected to the first node.

4. The shift register unit according to claim 2, wherein the first control module comprises a fourth transistor, a control terminal of the fourth transistor is electrically connected to the first node, a first terminal of the fourth transistor is electrically connected to the second clock signal lead, and a second terminal of the fourth transistor is electrically connected to the second node.

5. The shift register unit according to claim 4, wherein the second control module comprises a fifth transistor, a control terminal of the fifth transistor is electrically connected to the input terminal, a first terminal of the fifth transistor is electrically connected to the first voltage signal lead, and a second terminal of the fifth transistor is electrically connected to the third node.

6. The shift register unit according to claim 5, wherein the second control module further comprises a sixth transistor, a control terminal of the sixth transistor is electrically connected to the first clock signal lead, a first terminal of the sixth transistor is electrically connected to the second voltage signal lead, and a second terminal of the sixth transistor is electrically connected to the third node.

7. The shift register unit according to claim 6, wherein the third control module comprises a seventh transistor, a control terminal of the seventh transistor is electrically connected to the third node, a first terminal of the seventh transistor is electrically connected to the fourth node, and a second terminal of the seventh transistor is electrically connected to the second node.

8. The shift register unit according to claim 7, wherein the third control module further comprises an eighth transistor, a control terminal of the eighth transistor is electrically connected to the second clock signal lead, a first terminal of the eighth transistor is electrically connected to the second voltage signal lead, and a second terminal of the eighth transistor is electrically connected to the fourth node.

9. The shift register unit according to claim 8, wherein the first output module comprises a ninth transistor, a control terminal of the ninth transistor is electrically connected to the second node, a first terminal of the ninth transistor is electrically connected to the first voltage signal lead, and a second terminal of the ninth transistor is electrically connected to the output terminal; and the second output module comprises a tenth transistor, a control terminal of the tenth transistor is electrically connected to the first node, a first terminal of the tenth transistor is electrically connected to the first clock signal lead, and a second terminal of the tenth transistor is electrically connected to the output terminal.

10. A gate driving circuit, comprising:

the shift register unit, comprising:

an input module configured to transmit a signal at an input terminal of the shift register unit to a first node in response to a second clock signal;

a first control module configured to transmit the second clock signal to a second node in response to a signal at the first node;

a second control module configured to transmit a first voltage signal or a first clock signal to a third node in response to the signal at the input terminal; and configured to transmit a second voltage signal to the third node in response to the first clock signal;

a third control module configured to transmit the second voltage signal to a fourth node in response to the second clock signal; and configured to transmit the second voltage signal or a signal at the second node to the fourth node in response to a signal at the third node; and configured to transmit the second voltage signal to the second node in response to the second clock signal and the signal at the third node;

a first output module configured to transmit the first voltage signal to an output terminal of the shift register unit in response to the signal at the second node;

a second output module configured to transmit the first clock signal to the output terminal in response to the signal at the first node;

a first capacitor connected between the first node and the output terminal;

a second capacitor connected between the second node and a first voltage signal lead; and a third capacitor connected between the third node and the fourth node.

11. A display device, comprising the gate driving circuit according to claim 10.

12. The gate driving circuit according to claim 10, wherein the input module comprises a first transistor, a control terminal of the first transistor is electrically connected to a second clock signal lead, a first terminal of the first transistor is electrically connected to the input terminal, and a second terminal of the first transistor is electrically connected to the first node.

13. The gate driving circuit according to claim 12, wherein the input module further comprises a second transistor and a third transistor, a control terminal of the second transistor is electrically connected to a second voltage signal lead, a first terminal of the second transistor is electrically connected to the second terminal of the first transistor, and a second terminal of the second transistor is electrically connected to a first terminal of the third transistor;

a control terminal of the third transistor is electrically connected to the second voltage signal lead, and a second terminal of the third transistor is electrically connected to the first node.

14. The gate driving circuit according to claim 12, wherein the first control module comprises a fourth transistor, a control terminal of the fourth transistor is electrically connected to the first node, a first terminal of the fourth transistor is electrically connected to the second clock signal lead, and a second terminal of the fourth transistor is electrically connected to the second node.

15. The gate driving circuit according to claim 14, wherein the second control module comprises a fifth transistor, a control terminal of the fifth transistor is electrically connected to the input terminal, a first terminal of the fifth transistor is electrically connected to the first voltage signal lead, and a second terminal of the fifth transistor is electrically connected to the third node.

16. The gate driving circuit according to claim 15, wherein the second control module further comprises a sixth transistor, a control terminal of the sixth transistor is electrically connected to the first clock signal lead, a first terminal of the sixth transistor is electrically connected to the second voltage signal lead, and a second terminal of the sixth transistor is electrically connected to the third node.

17. The gate driving circuit according to claim 16, wherein the third control module comprises a seventh transistor, a control terminal of the seventh transistor is electrically connected to the third node, a first terminal of the seventh transistor is electrically connected to the fourth node, and a second terminal of the seventh transistor is electrically connected to the second node.

18. The gate driving circuit according to claim 17, wherein the third control module further comprises an eighth transistor, a control terminal of the eighth transistor is electrically connected to the second clock signal lead, a first terminal of the eighth transistor is electrically connected to the second voltage signal lead, and a second terminal of the eighth transistor is electrically connected to the fourth node.

19. The gate driving circuit according to claim 18, wherein the first output module comprises a ninth transistor, a control terminal of the ninth transistor is electrically connected to the second node, a first terminal of the ninth transistor is electrically connected to the first voltage signal lead, and a second terminal of the ninth transistor is electrically connected to the output terminal; and the second output module comprises a tenth transistor, a control terminal of the tenth transistor is electrically connected to the first node, a first terminal of the tenth transistor is electrically connected to the first clock signal lead, and a second terminal of the tenth transistor is electrically connected to the output terminal.

* * * * *